United States Patent
Tanaka et al.

(10) Patent No.: US 6,403,289 B1
(45) Date of Patent: Jun. 11, 2002

(54) DEVELOPER FOR PHOTOSENSITIVE POLYIMIDE RESIN COMPOSITION

(75) Inventors: Akira Tanaka; Kei Sakamoto; Yasuhiro Yoneda; Kishio Yokouchi, all of Kawasaki (JP)

(73) Assignees: Nippon Zeon Co., Ltd., Tokyo; Fujitsu Limited, Kanagawa, both of (JP)

(*) Notice: Subject to any disclaimer, the term of this patent is extended or adjusted under 35 U.S.C. 154(b) by 0 days.

(21) Appl. No.: 09/183,341

(22) Filed: Oct. 30, 1998

(30) Foreign Application Priority Data

Oct. 31, 1997 (JP) .............................................. 9-316139

(51) Int. Cl.$^7$ ................................................. G03F 7/32
(52) U.S. Cl. ....................... 430/329; 430/322; 430/325; 430/331
(58) Field of Search ................................ 430/322, 325, 430/329, 331

(56) References Cited

U.S. PATENT DOCUMENTS

| | | | | |
|---|---|---|---|---|
| 4,423,138 A | * | 12/1983 | Guild | 430/326 |
| 4,820,621 A | * | 4/1989 | Tanka | 430/331 |
| 4,837,124 A | * | 6/1989 | Wu et al. | 430/270 |
| 5,238,784 A | | 8/1993 | Tokoh et al. | 430/283 |
| 5,449,584 A | * | 9/1995 | Banba | 430/190 |
| 5,614,354 A | | 3/1997 | Eguchi et al. | 430/326 |
| 5,744,286 A | * | 4/1998 | Choi | 430/326 |
| 5,777,068 A | | 7/1998 | Tanaka et al. | 528/353 |
| 5,856,065 A | * | 1/1999 | Hagen | 430/283.1 |
| 5,886,136 A | * | 3/1999 | Tanaka | 528/353 |

FOREIGN PATENT DOCUMENTS

| | | |
|---|---|---|
| JP | 58-66940 | 4/1983 |
| JP | 62-127738 | 6/1987 |
| JP | 63-183439 | 7/1988 |
| JP | 1-259351 | 10/1989 |
| JP | 2-255898 | 10/1990 |
| JP | 4-77741 | 3/1992 |
| JP | 4-133062 | 5/1992 |
| JP | 4-363361 | 12/1992 |
| JP | 5-5995 | 1/1993 |
| JP | 5-86154 | 4/1993 |
| JP | 5-100424 | 4/1993 |
| JP | 5-281717 | 10/1993 |
| JP | 6-180505 | 6/1994 |
| JP | 6-301217 | 10/1994 |
| JP | 8-82931 | 3/1996 |
| JP | 8-95247 | 4/1996 |
| JP | 9-90629 | 4/1997 |
| JP | 9-90630 | 4/1997 |

OTHER PUBLICATIONS

Kubota et al, *J. Macromol. Sci.–Chem.*, A24(12):1407–1422 (1987).

* cited by examiner

*Primary Examiner*—Mark F. Huff
*Assistant Examiner*—Nicole Barreca
(74) *Attorney, Agent, or Firm*—Dinsmore & Shohl LLP

(57) ABSTRACT

The invention relates to a developer for photosensitive polyimide resin compositions, comprising an alkaline aqueous solution containing a basic compound (A) represented by a formula (1):

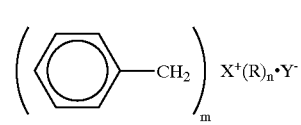

(1)

wherein $X^+$ is $N^+$ or $P^+$, R is an alkyl group having 1 to 20 carbon atoms or an aryl group having 6 to 10 ring forming carbon atoms, $Y^-$ is a monovalent anion, m is 0 or 1, n is 3 or 4, and m+n is 4, with the proviso that when m is 0, n is 4, and R is an alkyl group, the total number of carbon atoms of 4 alkyl groups is at least 13, or when m is 1, n is 3, and R is an alkyl group, the total number of carbon atoms of 3 alkyl groups is at least 6.

23 Claims, No Drawings

DEVELOPER FOR PHOTOSENSITIVE POLYIMIDE RESIN COMPOSITION

FIELD OF THE INVENTION

The present invention relates to a developer for photosensitive polyimide resin compositions, and more particularly to a developer comprising an aqueous alkaline solution containing a basic compound. The developer according to the present invention is used in development after patterning exposure of a photosensitive layer formed from a photosensitive polyimide resin composition containing a polyamic acid.

BACKGROUND OF THE INVENTION

In a fabrication process of a semiconductor device, a photoresist is separated and removed from a substrate after its role has been filled in a step of etching or the like. However, such a photoresist film is left as a permanent film if it is used as a surface-protecting film or a layer insulation film. Therefore, it is required to have electrically and mechanically high characteristics or properties. Further, such a film also must resist a high temperature applied in the fabrication process of the semiconductor device.

In recent years, a film formed of a photosensitive polyimide resin composition has been used in such an application. The polyimide resin is excellent in electrical and mechanical characteristics, and heat resistance and is used as a surface-protecting film or layer insulation film for a semiconductor device, or the like. In order to selectively provide a film of a polyimide resin on minute parts of the semiconductor device, it is convenient to use a photosensitive polyimide resin composition containing a polyamic acid (i.e., a polyimide precursor). The photosensitive polyimide resin composition is coated on a substrate and dried to form a photosensitive layer. The photosensitive layer is then subjected to patterning exposure and developed to remove an unexposed portion thereof, thereby forming a pattern. The pattern thus formed is heat-treated as needed to cyclize the polyamic acid, thereby polyimidating it.

Examples of a developer heretofore used in a developing step of the photosensitive polyimide resin composition include developers obtained by adding a lower alcohol such as methanol, or water as a poor solvent to an aprotic polar solvent such as N-methyl-2-pyrrolidone (Japanese Patent Application Laid-Open Nos. 66940/1983 and 127738/1987) and developers obtained by adding an aromatic hydrocarbon such as xylene to an aprotic polar solvent such as N-methyl-2-pyrrolidone (Japanese Patent Application No. 255898/1990, corresponding with Japanese Patent Application Laid-Open No. 133062/1992". The developers all comprise an organic solvent as a main component.

In recent years, it has been indicated that when an organic solvent is used as a developer, developer cost becomes high, explosion-proof apparatus are required, operator's health may be endangered, and natural environment is adversely affected. Therefore, attention is paid to polyamic acids and photosensitive polyimide resin compositions developable with an alkaline developer, particularly, a developer comprising an alkaline aqueous solution in place of the organic solvent.

As alkali-developed or alkaline aqueous solution-developed polyamic acids, there have hitherto been reported, for example, those obtained by introducing a protective group capable of leaving into a carboxyl group or a phenolic hydroxyl group under acid or alkaline conditions [J. Macromol. Sci. Chem., A24 (12) pages 1407–1422 (1987), Japanese Patent Application Laid-Open No. 259351/1989 and Japanese Patent Application Laid-Open No. 363361/1992]. However, these polyamic acids require to introduce a substituent group great in steric hindrance through a covalent bond into a main-chain carboxyl group or side-chain hydroxyl group. Therefore, they involve such problems that their synthetic processes become complicated, they require a high curing temperature, and film properties of films formed therefrom are deteriorated.

It has been proposed to incorporate a dihydropyridine derivative, which is a photo-induced base generator, and accelerate the imidation-facilitating effect of a base formed by exposure by PEB (post-exposure baking), thereby conducting development with an alkaline developer utilizing a difference in solubility caused by the imidation (Japanese Patent Application Laid-Open Nos. 5995/1993 and 281717/1993). However, these processes involve such problems that the PEB treatment is required, and the film formed has a low sensitivity to exposure, and so an exposure value must be made greater.

It has also been proposed to use a photosensitive resin composition obtained by adding a specific photopolymerizable monomer as a crosslinking auxiliary to a polyamic acid to conduct development with an alkaline developer or alkaline aqueous solution (Japanese Patent Application Laid-Open Nos. 183439/1988 and 100424/1993). In these processes, special polymerizable unsaturated compounds such as those having an isocyanate structure or a urethane structure are used as the photopolymerizable monomers. Since the polyamic acids used in these processes have no photopolymerizable group in their structures, there is a problem that sensitivity and resolution are insufficient.

It has been proposed to use an alkaline aqueous solution containing an amino-alcohol and another alkali than the amino-alcohol as a developer for photosensitive polyimide precursors (Japanese Patent Application Laid-Open No. 301217/1994). This publication discloses, for example, tetramethylammonium hydroxide, choline and sodium hydroxide as other alkalis than the amino-alcohol. A feature of the invention set forth in this publication is to provide a developer having a stronger basicity than that of a developer used for positive resists comprising a novolak resin as a resin component. It is said that when the use of this developer as a developer for a positive photosensitive polyimide precursor is advantageous to the control of developing speed and the formation of a minute pattern. However, this developer is too strong in dissolving power when a carboxyl group having salt-forming ability exists in a pattern-formed portion of the photosensitive polyimide precursor, so that swelling of the resin occurs at the pattern-formed portion, deterioration in resolution and the rate of residual film is caused, and consequently the impossibility of forming a pattern may be incurred in an extreme case.

It has been proposed to conduct development with an alkaline aqueous solution upon formation of a pattern using a photosensitive, heat-resistant polymer composition comprising a polyamic acid with a photosensitive group introduced into its recurring units, a sensitizer, and a sensitizing auxiliary (Japanese Patent Application Laid-Open No. 180505/1994). A wiring structure on which a surface-protecting film composed of a cured film of the photosensitive, heat-resistant polymer composition has been formed is produced by this process. When an alkaline aqueous solution containing tetramethylammonium hydroxide or the like, which is specifically disclosed in this publication, is used as a developer, however, it is difficult to fully prevent the swelling of a resin portion left as a pattern, so that resolution becomes insufficient, and moreover the strength of the resulting film is deteriorated.

SUMMARY OF THE INVENTION

It is an object of the present invention to provide a developer for photosensitive polyimide resin compositions, which scarcely swell a pattern-formed portion of a photosensitive polyimide resin composition upon development, has excellent resolution, causes no film separation upon development and scarcely affects film properties of a film obtained after curing.

The present inventors have carried out an extensive investigation with a view toward overcoming the above-described problems involved in the prior art. As a result, it has been found that when an alkaline aqueous solution containing a specific quaternary ammonium salt or quaternary phosphonium salt having a bulky substituent group as a basic compound (alkali) is used as a developer, the swelling of a resin portion left as a pattern is prevented, so that sensitivity and resolution are greatly enhanced. In addition, since the infiltration of the alkaline component into the resin portion left as the pattern is prevented, deterioration in the strength of a developed film, particularly, surface adhesion strength is effectively prevented.

When the specific basic compound is used in combination with another basic compound than such a compound, developability, resolution and the surface adhesion strength of a developed film can be balanced with one another at a high level. When an organic solvent and a surfactant are added to the developer according to the present invention, the resolution, margin of film separation upon development, development time, etc. can be further improved.

The photosensitive polyimide resin composition preferably comprises a polyamic acid having at least one photopolymerizable functional group in its molecular chain (particularly, at both terminals). The polyamic acid preferably has a structure that contains a carboxyl group capable of forming a salt with an alkali.

The present invention has been led to completion on the basis of these findings.

According to the present invention, there is thus provided a developer for photosensitive polyimide resin compositions, which is suitable for use in development after patterning exposure of a photosensitive layer formed from a photosensitive polyimide resin composition containing a polyamic acid, the developer comprising an alkaline aqueous solution containing a basic compound (A) represented by a formula (1):

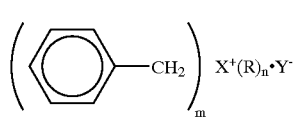

(1)

wherein $X^+$ is $N^+$ or $P^+$, R is an alkyl group having 1 to 20 carbon atoms or an aryl group having 6 to 10 ring forming carbon atoms, $Y^-$ is a monovalent anion, m is 0 or 1, n is 3 or 4, and m+n is 4, with the proviso that when m is 0, n is 4, and R is an alkyl group, the total number of carbon atoms of 4 alkyl groups is at least 13, or when m is 1, n is 3, and R is an alkyl group, the total number of carbon atoms of 3 alkyl groups is at least 6.

DETAILED DESCRIPTION OF PREFERRED EMBODIMENTS

<Developer>

The basic compound (A) useful in the practice of the present invention is a compound represented by the above formula (1). In the formula (1), 3 or 4 R groups may be the same or different from one another. The basic compound (A) contains a cationic component represented by a formula (2):

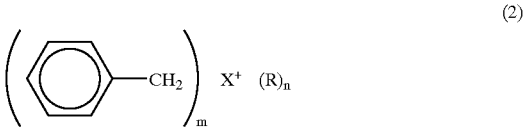

(2)

wherein the respective characters have the same meanings as defined in the formula (1), and an anionic component ($Y^-$) as a counter ion.

Specific examples of the basic compound (A) include tetraalkylammonium salts represented by a formula (3):

(3)

wherein $R_1$ is an alkyl group having 1 to 20 carbon atoms, with the proviso that the total number of carbon atoms of 4 alkyl groups is at least 13, preferably at least 16, and 4 alkyl groups may be the same or different from one another; benzyltrialkylammonium salts represented by a formula (4):

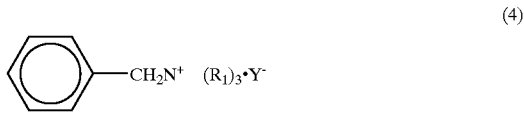

(4)

wherein $R_1$ is an alkyl group having 1 to 20 carbon atoms, with the proviso that the total number of carbon atoms of 3 alkyl groups is at least 6, and 3 alkyl groups may be the same or different from one another; benzyltriarylammonium salts represented by a formula (5):

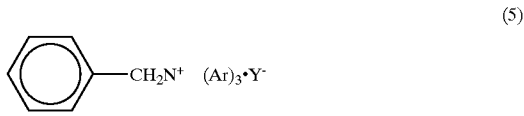

(5)

wherein Ar is an aryl group having 6 to 10 ring forming carbon atoms; tetraalkylphosphonium salts represented by a formula (6):

(6)

wherein $R_1$ is an alkyl group having 1 to 20 carbon atoms, with the proviso that the total number of carbon atoms of 4 alkyl groups is at least 13, and 4 alkyl groups may be the same or different from one another; benzyltrialkylphosphonium salts represented by a formula (7):

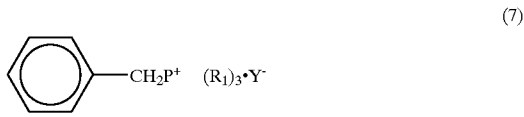

(7)

wherein $R_1$ is an alkyl group having 1 to 20 carbon atoms, with the proviso that the total number of carbon atoms of 3 alkyl groups is at least 6, and 3 alkyl groups may be the same or different from one another; and benzyltriarylphosphonium salts represented by a formula (8):

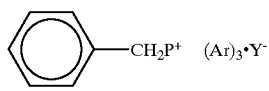

(8)

wherein Ar is an aryl group having 6 to 10 ring forming carbon atoms.

No particular limitation is imposed on the anion (Y$^-$), and examples thereof include a hydroxy anion (OH$^-$), and halide anions such as Cl$^-$, Br$^-$, F$^-$ and I$^-$. Of these, OH$^-$ is preferred.

More specifically, examples of the basic compound (A) include tetrabutylammonium hydroxide, cetyltrimethylammonium hydroxide, tetrapentylammonium hydroxide, tetrahexylammonium hydroxide, benzyltriethylammonium hydroxide, benzyltriphenylammonium hydroxide, tetrabutylphosphonium hydroxide and benzyltriethylphosphonium hydroxide. Of these, tetrabutylammonium hydroxide and benzyltriethylammonium hydroxide are particularly preferred. These basic compounds (A) may be used either singly or in any combination thereof.

The content of the basic compound (A) in the alkaline aqueous solution is generally 0.025 to 30 wt. %, preferably 0.1 to 15 wt. %. The content of the basic compound (A) is desirably adjusted in such a manner that the pH of the alkaline aqueous solution is generally 10.0 or higher, preferably 10.0 to 13.8, more preferably 11.0 to 13.0.

If the content of the basic compound (A) is too low, and the pH of the alkaline aqueous solution is lower than 10.0, the developing speed is slowed according to the kind of a polyamic acid contained in a photosensitive polyimide resin composition, and there is also a possibility that the swelling of the surface of a resin left as a pattern may be not sufficiently prevented, and so resolution may be deteriorated. In particular, if the film thickness of a film formed from the photosensitive polyimide resin composition is too great, development becomes hard to proceed, so that it takes a very long time to develop the film, and problems of film separation and the like upon the development are also easy to arise.

If the content of the basic compound (A) is too high, and the pH of the alkaline aqueous solution is higher than 13.8, the developing speed becomes too fast, and so it is difficult to control the development time or formation of a pattern. Further, if the content of the basic compound (A) is too high, a hydrophobic salt of the carboxyl group contained in the polyamic acid with the cationic component represented by the formula (2) is formed on the surface of a film to be developed with the resulting alkaline aqueous solution (developer) to prevent the infiltration of the developer into the film more than the film needs, so that resolution is also deteriorated.

In the present invention, the basic compound (A) may be used by itself. However, an additional basic compound (B) may also be used in combination. As the additional basic compound, may be used that heretofore used for alkaline developers. Examples of the additional basic compound (B) include tetraalkylammonium salts the total number of carbon atoms of 4 alkyl groups of which is at most 12, choline, tertiary aliphatic amines the number of carbon atoms of alkyl groups of which is 1 to 5, pyridine and derivatives thereof, and inorganic basic compounds. Preferable examples of the basic compounds (B) include tetramethylammonium hydroxide, tetraethylammonium hydroxide, choline, sodium hydroxide, potassium hydroxide, barium hydroxide, lithium hydroxide, sodium carbonate, potassium carbonate, barium carbonate and lithium carbonate. Of these, tetramethylammonium hydroxide, tetraethylammonium hydroxide and choline are particularly preferred. These basic compounds (B) may be used either singly or in any combination thereof.

The content of the basic compound (B) in the alkaline aqueous solution is generally 0.025 to 30 wt. %, preferably 0.1 to 15 wt. %. However, the contents of the basic compound (A) and the basic compound (B) are desirably adjusted in such a manner that the pH of the alkaline aqueous solution is generally 10.0 or higher, preferably 10.0 to 13.8, more preferably 11.0 to 13.0. If the content of the basic compounds is too high, a resin portion to be left in itself upon development is also dissolved, and so difficulty is encountered on formation of a pattern.

When the basic compound (A) represented by the formula (1) and the additional basic compound (B) are used in combination, a molar ratio (A):(B) of both compounds is generally 2:98 to 99:1, preferably 5:95 to 90:10, more preferably 10:90 to 90:10, most preferably 30:70 to 75:25. The combined use of both compounds within this range is desirable because developability, resolution, the surface adhesion strength of a developed film, and the like can be balanced with one another at a high level. In the present invention, mol % is calculated on the basis of the cationic component.

Since the basic compound (A) represented by the formula (1) has substituent groups composed of a bulky hydrocarbon group, for example, a butyl group, cetyl group, pentyl group, hexyl group, benzyl group or phenyl group, a salt of the carboxyl group contained in the polyamic acid with the cationic component represented by the formula (2) is formed on the surface of a resin film left as a pattern when an aqueous solution containing the basic compound (A) is used as a developer, whereby a hydrophobic film is considered to be formed. As a result, it is considered that the infiltration of the alkaline aqueous solution into the film more than the film needs can be prevented, so that the swelling of the remaining film portion is prevented. On the other hand, the cationic component of the basic compound (B) typified by tetramethylammonium hydroxide forms a salt having high solubility in water with the carboxyl group in the film component removed by the development. Therefore, it has an effect of increasing dissolving speed upon the development of the film. Accordingly, when these two basic compounds are effectively combined, the optimization of development time and resolution can be achieved, so that excellent sensitivity and resolution can be attained.

The medium of the alkaline aqueous solution used as a developer in the present invention may comprises at least 51 wt. % of water and at most 49 wt. % of at least one selected from the group consisting of organic solvents and surfactants. When the organic solvent and surfactant are incorporated in the developer, the film separation upon development can be prevented, and moreover the degree of infiltration of the developer into the film to be developed can be controlled, resulting in achieving effects of stabilizing resolution and enlarging development margin for formation of a pattern due to the prevention of film separation upon development.

Examples of the organic solvents include oxygen-containing compounds such as monohydric alcohols, polyhydric alcohols, ketones, esters and mixtures thereof. Specific examples of the organic solvents include monohydric alcohols such as methanol, ethanol, isopropyl alcohol and cyclopentanol; ketones such as cyclopentanone and methyl ethyl ketone; polyhydric alcohols such as propylene glycol and glycerol; and esters such as ethyl acetate and ethyl lactate. These organic solvents are used in a proportion of 1 to 40 wt. %, more preferably 3 to 30 wt. % based on the whole medium.

No particular limitation is imposed on the surfactants. Examples of commercially available products thereof include Surfynol 440, Surfynol 465, Pluronic L-62 and Adekatol LO-7. These surfactants serve to improve the wettability of the film surface by water to improve the initial infiltration of the developer, thereby controlling developing speed. The surfactant has the improving effect even in an amount as small as 0.01 to 1 wt. %. It is particularly preferred that the surfactant be used in combination with the organic solvent.

As needed, the developer according to the present invention may contain various kinds of additives within limits not impeding the object of the present invention.

<Photosensitive Polyimide Resin Composition>

Examples of photosensitive polyimide resin compositions which can be developed by the developer according to the present invention include photosensitive resin compositions comprising a polyamic acid having photopolymerizable functional groups (actinic ray-sensitive functional groups) at both terminals (for example, Japanese Patent Application Laid-Open Nos. 82931/1996, 95247/1996, 77741/1992 and 86154/1993), photosensitive resin compositions comprising a polyamic acid having a photopolymerizable functional groups in its diamine structure (for example, Japanese Patent Application Laid-Open No. 90629/1997) and photosensitive resin compositions obtained by incorporating a photopolymerizable monomer into a polyamic acid (for example, Japanese Patent Application Laid-Open No. 90630/1997).

The polyamic acid is preferably such that the carboxyl group in the film-forming resin at exposed and unexposed portions can form a salt with the cationic component of the basic compound (A). Further, the polyamic acid preferably has photopolymerizable functional group(s) in its molecular chain, more preferably at both terminals. These photosensitive polyimide resin compositions contain a photosensitive auxiliary, a photopolymerization initiator and the like as needed and are prepared by uniformly dissolving or dispersing the individual components in an organic solvent.

Among the photosensitive polyimide resin compositions, those comprising a polyamic acid having actinic ray-sensitive functional groups at both terminals as described in Japanese Patent Application Laid-Open Nos. 82931/1996 and 95247/1996 are particularly preferred because the molecular structure of the main chain can be controlled to facilitate the development with the alkaline aqueous solution.

As examples of such a polyamic acid with actinic ray-sensitive functional groups introduced at both terminals thereof, may be mentioned polyamic acids (A) having, in its main chain, repeating units represented by a formula (9):

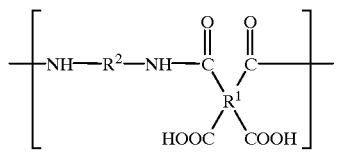

(9)

wherein $R^1$ is a tetravalent organic group, and $R^2$ is a bivalent organic group, and at both terminals thereof, at least one actinic ray-sensitive functional group selected from the group consisting of a group $Z^1$ represented by a formula (10):

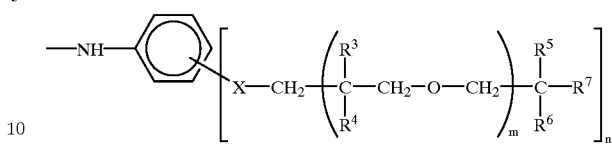

(10)

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are independently a substituent group having a photopolymerizable carbon-carbon double bond, m is 0 or 1, and n is an integer within a range of from 1 to 3, and a group $Z^2$ represented by a formula (11):

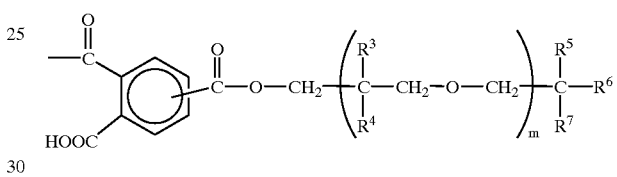

(11)

wherein $R^3$, $R^4$, $R^5$, $R^6$ and $R^7$ are independently a substituent group having a photopolymerizable carbon-carbon double bond, and m is 0 or 1.

When the repeating unit represented by the formula (9) is defined as a unit molecular weight herein, it is preferred that monomer components (diamine compound, tetracarboxylic dianhydride, etc.) be selected in such a manner that a unit molecular weight per carboxyl group is within a range of from 200 to 300.

As such polyamic acids, may be mentioned a polyamic acid (A1) which has, at both terminals thereof, the actinic ray-sensitive functional groups $Z^1$ represented by the formula (10) and is represented by a formula (12):

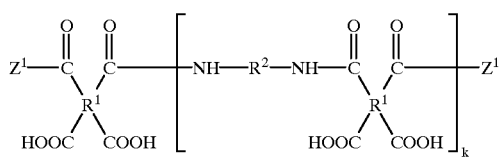

(12)

wherein $R^1$ is a tetravalent organic group, $R^2$ is a bivalent organic group, k is an integer within a range of from 5 to 10,000, and $Z^1$ is the actinic ray-sensitive functional group represented by the formula (10), and a polyamic acid (A2) which has, at both terminals thereof, the actinic ray-sensitive functional groups $Z^2$ represented by the formula (11) and is represented by a formula (13):

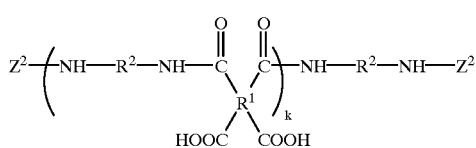

(13)

wherein $R^1$ is a tetravalent organic group, $R^2$ is a bivalent organic group, k is an integer within a range of from 5 to 10,000, and $Z^2$ is the actinic ray-sensitive functional group represented by the formula (11).

The polyamic acid (A1) is generally obtained by adding a tetracarboxylic acid or an anhydride thereof to a mixture of a diamine compound and an aminobenzene derivative such as tris(methacryloyl)-pentaerythritol p-aminobenzoate and subjecting these components to a condensation reaction in accordance with a method known per se in the art. The polyamic acid (A2) is generally obtained by adding a trimellitic acid derivative such as the tris(methacryloyl) pentaerythritol ester of trimellitic anhydride and a tetracarboxylic acid or an anhydride thereof to a diamine compound and subjecting these components to a condensation reaction in accordance with a method known per se in the art.

Examples of the diamine compound include aromatic diamines such as 4,4'-diaminobenzanilide, 3,4'-diaminobenzanilide, 3,3'-diaminobenzanilide, 4,3'-diaminobenzanilide, 3,3'-di(trifluoromethyl)-4,4'-diaminobiphenyl, 2,2'-di(trifluoromethyl)-4,4'-diaminobiphenyl, 2,2'-di(p-aminophenyl)-6,6'-bibenzoxazole, 2,2'-di(p-aminophenyl)-5,5'-bibenzoxazole, m-phenylenediamine, 1-isopropyl-2,4-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, 1,4-bis(4-aminophenoxy) benzene, benzidine, 4,4"-diamino-p-terphenyl, 3,3"-diamino-p-terphenyl, bis(p-aminocyclohexyl)methene, bis (p-β-amino-t-butylphenyl) ether, bis(p-β-methyl-δ-aminopentyl)benzene, p-bis(2-methyl-4-aminopentyl) benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine and p-xylylenediamine; heterocyclic diamines such as 2,6-diaminopyridine, 2,5-diaminopyridine and 2,5-diamino-1,3, 4-oxadiazole; alicyclic diamines such as 1,4-diamino-cyclohexane; aliphatic diamines such as piperazine, methylenediamine, ethylenediamine, propylenediamine, 2,2-dimethylpropylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 5-methylnonamethylenediamine, 2,5-dimethylnonamethylenediamine, decamethylenediamine, 1,10-diamino-1,10-dimethyldecane, 2,11-diaminododecane, 1,12-diaminooctadecane, 2,12-diaminooctadecane and 2,17-diaminoeicosane; diaminosiloxane; 2,6-diamino-4-carboxylic benzene; and 3,3'-diamino-4,4'-dicarboxylic benzidine.

These diamine compounds may be used either singly or in any combination thereof. $R^2$ in the formula (9) is a bivalent group derived from a diamine compound such as an aromatic diamine, heterocyclic diamine, alicyclic diamine or aliphatic diamine.

Examples of the tetracarboxylic acid or the anhydride thereof include aromatic tetracarboxylic dianhydrides such as pyromellitic dianhydride, 3,3'4,4'-benzophenone tetracarboxylic dianhydride, benzene-1,2,3,4-tetracarboxylic dianhydride, 2,2',3,3'-benzophenone tetracarboxylic dianhydride, 2,3,3',4'-benzophenone tetracarboxylic dianhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,2,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydronaphthalene-2,3,6,7-tetracarboxylic dianhydride, 2,6-dichloronaphthalene-1,4,5, 8-tetracarboxylic dianhydride, 2,7-dichloronaphthalene-1,4, 5,8-tetracarboxylic dianhydride, 2,3,6,7-tetrachloronaphthalene-1,4,5,8-tetracarboxylic dianhydride, 1,4,5,8-tetrachloronaphthalene-2,3,6,7-tetracarboxylic dianhydride, 3,3',4,4'-diphenyl-tetracarboxylic dianhydride, 2,2',3,3'-diphenyl-tetracarboxylic dianhydride, 2,3,3',4'-diphenyl-tetracarboxylic dianhydride, 2,3",4,4"-p-terphenyl-tetracarboxylic dianhydride, 2,2",3,3"-p-terphenyl-tetracarboxylic dianhydride, 2,3,3",4"-p-terphenyl-tetracarboxylic dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,18-tetracarboxylic dianhydride, phenanthrene-1,2,6,7-tetracarboxylic dianhydride and phenanthrene-1,2,9,10-tetracarboxylic dianhydride, and hydrogenated products thereof; alicyclic dianhydrides such as cyclopentane-1,2,3, 4-tetracarboxylic dianhydride, cyclobutane-tetracarboxylic dianhydride, bicyclo[2,2,2]octa-7-en-2-exo,3-exo,5-exo,6-exotetracarboxylic acid 2,3:5,6-dianhydride and bicyclo[2, 2,1]heptane-2-exo,3-exo,5-exo,6-exotetracarboxylic acid 2,3:5,6-dianhydride; and heterocyclic derivative dianhydrides such as pyrazine-2,3,5,6-tetracarboxylic dianhydride, pyrrolidine-2,3,4,5-tetracarboxylic dianhydride and thiophene-2,3,4,5-tetracarboxylic dianhydride. $R^1$ in the formula (9) is a tetravalent organic group derived from a tetracarboxylic acid or the dianhydride thereof, such as an aromatic tetracarboxylic dianhydride or a hydrogenated product thereof, an alicyclic dianhydride, or a heterocyclic derivative acid dianhydride.

As a compound which reacts with carboxyl groups of a tetracarboxylic acid or the dianhydride thereof to give the substituent group $Z^1$, an aminobenzene derivative, preferably an aminobenzenecarboxylic acid ester is used. Specific examples of the aminobenzenecarboxylic acid ester include tris(methacryloyl)pentaerythritol o-aminobenzoate, tris (acryloyl)pentaerythritol o-aminobenzoate, tris (methacryloyl)pentaerythritol m-aminobenzoate, tris (acryloyl)pentaerythritol m-aminobenzoate, tris (methacryloyl)pentaerythritol p-aminobenzoate, tris (acryloyl)pentaerythritol p-aminobenzoate, tris (methacryloyl)pentaerythritol di-5-aminoisophthalate, tris (acryloyl)pentaerythritol di-5-aminoisophthalate, pentakis (methacryloyl) dipentaerythritol o-aminobenzoate, pentakis (acryloyl)dipentaerythritol o-aminobenzoate, pentakis (methacryloyl)dipentaerythritol m-aminobenzoate, pentakis( acryloyl)dipentaerythritol m-aminobenzoate, pentakis(methacryloyl)dipentaerythritol p-aminobenzoate and pentakis(acryloyl)dipentaerythritol p-aminobenzoate. Of these, tris(methacryloyl)pentaerythritol p-aminobenzoate is particularly preferred because it is excellent in points of synthesizing cost, handling properties, sensitivity, resolution and the like.

In order to synthesize the polyamic acid (A1) with the actinic ray-sensitive functional groups $Z^1$ represented by the formula (10) introduced at both terminals thereof, a tetra-carboxylic acid or an anhydride thereof is added to a mixture of a diamine compound and an aminobenzene derivative, and these components are subjected to a condensation reaction in accordance with a method known per se in the art. More specifically, in order to synthesize the polyamic acid (A1) with the actinic ray-sensitive functional groups introduced at both terminals thereof, the individual components are used in the following proportions. Namely, ① the diamine compound is generally used in a proportion of 0.850 to 0.990 moles, preferably 0.900 to 0.970 moles per mole of the tetracarboxylic acid or the anhydride thereof, ② the aminobenzene derivative is generally used in a proportion of 0.400 to 0.020 moles, preferably 0.110 to 0.040 moles, more preferably of 0.100 to 0.050 moles per mole of the diamine compound, and ③ the diamine compound and the aminobenzene derivative are generally used in a proportion of 1.100 to 0.900 moles, preferably 1.100 to 0.950 moles, more preferably 1.060 to 0.990 moles in total per mole of the tetracarboxylic acid or the anhydride thereof. In order to conduct the condensation reaction, it is only necessary to react the individual components with one another in a polar organic solvent such as dimethylacetamide in accordance with a method known per se in the art. The reaction is generally conducted at the range of from −20° C. to +80° C., for from 0.5 to 80 hours. When the monomeres have low solubility in a reaction system, the monomeres may be subjected to a pretreatment such as the monomers are heated to a temperature, at which they are soluble, to react them into an oligomer soluble in the reaction system.

As a compound which gives the substituent group $Z^2$ represented by the formula (11) to both terminals of a polyamic acid, a trimellitic acid derivative having a specific structure is used. As particularly preferred examples of the trimellitic acid derivative, may be mentioned the tris (acryloyl)pentaerythritol ester of trimellitic anhydride and the tris(methacryloyl)pentaerythritol ester of trimellitic anhydride because they are excellent in points of synthesizing cost, handling properties, sensitivity, resolution and the like.

In order to synthesize the polyamic acid (A2) with the actinic ray-sensitive functional group $Z^2$ represented by the formula (11) introduced at both terminals thereof, a trimellitic acid derivative and a tetracarboxylic acid or an anhydride thereof are added to a diamine compound, and these components are subjected to a condensation reaction in accordance with a method known per se in the art. Alternatively, a tetracarboxylic acid or an anhydride thereof may be added to a mixture of a diamine compound and a trimellitic acid derivative, and these components are subjected to a condensation reaction in accordance with a method known per se in the art. More specifically, in order to synthesize the polyamic acid (A2) with the actinic ray-sensitive functional group introduced at both terminals thereof, the individual components are used in the following proportions. Namely, ① the tetracarboxylic acid or the anhydride thereof is generally used in a proportion of 0.850 to 0.990 moles, more preferably 0.900 to 0.970 moles per mole of the diamine compound, ② the trimellitic acid derivative is generally used in a proportion of 0.400 to 0.020 moles, preferably 0.110 to 0.040 moles, more preferably 0.100 to 0.050 moles per mole of the tetracarboxylic acid or the anhydride thereof, and ③ the tetracarboxylic acid or the anhydride thereof and the trimellitic acid derivative are generally used in a proportion of 1.100 to 0.900 moles, preferably 1.100 to 0.990 moles, more preferably 1.060 to 1.020 moles in total per mole of the diamine compound. In order to conduct the condensation reaction, it is only necessary to react the individual components with one another in a polar organic solvent such as dimethylacetamide in accordance with a method known per se in the art. The reaction is generally conducted at the range of from −20° C. to +80° C., for from 0.5 to 80 hours. When the monomeres have low solubility in a reaction system, the monomeres may be subjected to a pretreatment such as the monomers are heated to a temperature, at which they are soluble, to react them into an oligomer soluble in the reaction system.

The polyamic acid (A) is combined with a photosensitive auxiliary (B) having a photopolymerizable functional group and a photopolymerization initiator (C), and intimately mixed in a solvent (D), thereby preparing a photosensitive polyimide resin composition.

No particular limitation is imposed on the photosensitive auxiliary (B) so far as it is generally known as a photosetting monomer. Typical examples of the photosensitive auxiliary include (meth)acrylic compounds such as pentaerythritol triacrylate. The photosensitive auxiliary is generally used in a proportion of 10 to 50 parts by weight, preferably 15 to 40 parts by weight, more preferably 20 to 35 parts by weight per 100 parts by weight of the polyamic acid.

Examples of the photopolymerization initiator (C) include Michler's ketone, benzoin, 2-methylbenzoin, benzoin methyl ether, benzoin ethyl ether, benzoin isopropyl ether, benzoin butyl ether, 2-t-butyl-anthraquinone, 1,2-benzo-9, 10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenyl-acetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acrylorange, erythrosine, phenanthrenequinone, 2-isopropylthioxanthone, 2,6-bis(p-diethylaminobenzylidene)-4-methyl-4-azacyclohexanone, 6-bis(p-dimethylaminobenzylidene)cyclopentanone, 2,6-bis (p-diethylaminobenzylidene)-4-phenylcyclohexanone, aminostyryl ketone, 3-ketocoumarin compounds, biscoumarin compounds, N-phenylglycine, N-phenyldiethanolamine and 3,3',4,4'-tetra(t-butyl peroxycarbonyl)benzophenone. The photopolymerization initiator is generally used in a proportion of 0.1 to 10 parts by weight, preferably 0.1 to 5 parts by weight, more preferably 1 to 5 parts by weight per 100 parts by weight of the polyamic acid.

Examples of the solvent include polar solvents such as N-methyl-2-pyrrolidone, N,N-dimethylacetamide, N,N- dimethylformamide, dimethyl sulfoxide, tetramethylurea, hexamethylphosphoric triamide and γ-butyrolactone. The solvent is used in an amount sufficient to uniformly dissolve the individual components. In particular, it is used in an amount sufficient to dissolve the polyamic acid. The proportion of the solvent to be used varies according to the kinds of the solvent and polyamic acid used. However, it is generally used in an amount 3 to 25 times, preferably 5 to 20 times, more preferably 6 to 10 times by weight as much as the polyamic acid.

For the photosensitive polyimide resin composition, there may be further used various additives such as an adhesion auxiliary, leveling agent and polymerization inhibitor as needed. Among the various additives, 1H-tetrazoles such as 1H-tetrazole, 5,5'-bis-1H-tetrazole or a derivative thereof is added, whereby corrosion against copper and copper alloys can be prevented, and so the adhesion of the polyimide film to a substrate can be improved, and the photosensitive film can be prevented from remaining without being developed. As examples of 1H-tetrazole and derivatives thereof, may be mentioned unsubstituted 1H-tetrazole; 5-substituted 1H-tetrazoles such as 5-methyl-1H-tetrazole, 5-phenyl-1H-tetrazole and 5-amino-1H-tetrazole; 1-substituted 1H-tetrazoles such as 1-methyl-1H-tetrazole; and 1,5-disubstituted 1H-tetrazole such as 1-phenyl-5-mercapto-1H-tetrazole. Of these, 1H-tetrazole and 5-substituted 1H-tetrazoles are particularly preferred.

The 1H-tetrazoles are generally used in a proportion of 0.05 to 20 parts by weight, preferably 0.1 to 5 parts by weight, more preferably 0.3 to 3.0 parts by weight per 100 parts by weight of the polyamic acid (in terms of solid content). If this proportion is too low, the effect of the addition becomes small. If the proportion is too high on the other hand, the effect may not be brought about correspondingly to such a proportion.

The 1H-tetrazoles are generally added to a solution of the polyamic acid into a resin composition (solution). The resultant composition is used in applications for coating on a substrate or the like to form a film.

The photosensitive polyimide resin compositions to which the developer according to the present invention can be applied are not limited to only the resin compositions comprising the polyamic acid (A) having the specific actinic ray-sensitive functional group. The developer according to the present invention may be applied to photosensitive polyimide resin compositions comprising, as a resin component, a polyamic acid with any of various photopolymerizable functional groups (actinic ray-sensitive functional groups) introduced thereinto so far as they may be developed with the developer.

<Pattern Forming Process>

A typical process for forming a pattern using the developer according to the present invention includes a process comprising ① coating a substrate such as a silicon wafer with a photosensitive polyimide resin composition (varnish) by a technique such as spin coating, ② drying the composition by a hot plate or oven to form a film, ③ exposing the film thus formed through a photomask, and than ④ developing the film.

As a developing process, there may be used various methods such as dip development in which a substrate is dipped into a developer in a developing trough, and ultrasonic dip development in which ultrasonic wave is applied upon dip development.

After the development, the substrate is generally washed with a rinsing liquid to remove the developer. As the rinsing liquid, water, or a solvent capable of mixing with water, such as methanol, ethanol, isopropyl alcohol, acetone, methyl cellosolve or ethyl cellosolve is used. Toluene, xylene or the lime may also be used. Water is preferred. A heat treatment (at 200 to 450° C.) is then conducted to convert the polyamic acid into a polyimide, whereby a final film can be obtained.

ADVANTAGES OF THE INVENTION

When the developer comprising the alkaline aqueous solution according to the present invention is used, resolution can be greatly enhanced upon formation of a pattern making use of a photosensitive polyimide resin composition, so that formation of a minute pattern becomes feasible. Since the alkaline aqueous solution is used as a developer, any explosion-proof apparatus is unnecessary in development facilities, developer cost and cost of waste water treatment can be reduced, and a great contribution to the safety of operators and natural environment can be made.

EMBODIMENTS OF THE INVENTION

The present invention will hereinafter be described more specifically by the following Referential Example, Examples and Comparative Examples. However, the present invention is not limited to these examples only.

Referential Example 1
Preparation of Photosensitive Polyimide Resin Composition A reactor equipped with a stirrer and a dry gas inlet pipe was charged with 45.9 g (0.202 mol) of 4,4'-diaminobenzanilide and 811 g of dimethylacetamide, and the mixture was stirred at 50° C. into a solution. This solution was reacted with 22.9 g (0.105 mol) of pyromellitic dianhydride and 33.8 g (0.105 mol) of 3,31',4,4'-benzophenonetetracarboxylic dianhydride at a reaction temperature of 50° C. for 3 hours. After cooling the reaction mixture to 10° C. or lower, 9.8 g (0.0455 mol) of pyromellitic dianhydride, 14.5 g (0.045 mol) of 3,3',4,4'-benzophenonetetracarboxylic dianhydride, 25.1 g (0.086 mol) of 1,4-bis(4-amino-phenoxy)benzene and 11.02 g (0.024 mol) of tris-(methacryloyl)pentaerythritol p-aminobenzoate as an amine for terminal modification were added as powder. The resultant mixture was stirred for 3 hours under cooling with ice water and then for 24 hours at room temperature, thereby synthesizing a polyamic acid.

To 597 parts by weight (100 parts by weight in terms of solid content) of the polyamic acid thus obtained, were added 2 parts by weight of 3,3',4,4'-tetra(t-butyl peroxycarbonyl)benzophenone ($\lambda_{max}$=340 nm; product of Nippon Oil & Fat Co., Ltd.), 2 parts by weight of N-phenylglycine, 0.5 parts by weight of 1H-tetrazole, and 32 parts by weight of triethylene glycol diacrylate (3EG-A, product of Kyoeisha Chemical Co., Ltd.) as a photosensitive auxiliary at room temperature into a solution, thereby obtaining a photosensitive polyimide resin composition (varnish).

EXAMPLE 1
<Resolution of Various Developers>

The photosensitive polyimide resin composition obtained in Referential Example 1 was coated on various kinds of substrates by a spin coater and dried at 70° C. for 6 minutes on a hot plate to form a film having a thickness of about 15 μm on each substrate. This substrate on which the film had been formed was exposed (exposure value: 1,000 mj in terms of g-rays) by means of a PLA-501F (manufactured by Canon Inc.) using a step tablet mask manufactured by TOPPAN PRINTING CO., LTD. and then subjected to ultrasonic dip development with each of various kinds of developers to comparatively evaluate the developing effects of the developers. The results are shown in Table 1.

<Measurement of Mechanical Strength of Film Surface: Evaluation of Adhesion Strength to Sputtered Chromium Film>

After the varnish synthesized in Referential Example 1 was coated on a silicon wafer substrate and dried to form a prebaked film, the whole surface of the film was exposed (exposure value: 1,000 mj in terms of g-rays). The thus-exposed film was then subjected to ultrasonic dip development with each of the various kinds of developers. The film was rinsed with water and then heat-treated at 350° C. for 2 hours in a nitrogen atmosphere to form a polyimide film. A chromium film was formed on the polyimide film by sputtering. The adhesion property between the polyimide film and the chromium film determined in terms of adhesive strength by the Sebastian method. The results are shown in Table 1.

TABLE 1

| Run No. | Composition of developer; ratio of alkaline components (Molar ratio) | Resolution L/S (μm) | PI/Cr Adhesion (MPa) | Development time min:sec |
|---|---|---|---|---|
| 1 | TPAH (100) | 25 | 35 | 5:30 |
| 2 | TMAH (100) | 25 | 32 | 5:20 |
| 3 | TMAH:TBAH (95:5) | 20 | 55 | 5:25 |
| 4 | TMAH:TBAH (90:10) | 17 | 57 | 5:25 |
| 5 | TMAH:TBAH (70:30) | 14 | 57 | 5:25 |
| 6 | TMAH:TBAH (50:50) | 12 | 58 | 5:25 |
| 7 | TMAH:TBAH (25:75) | 12 | 58 | 5:25 |
| 8 | TMAH:TBAH (10:90) | 12 | 58 | 5:30 |
| 9 | TBAH (100) | 13 | 58 | 5:45 |
| 10 | BTEAH (100) | 13 | 56 | 5:50 |
| 11 | CMAH (100) | 14 | 50 | 6:05 |

(Note)
(1) Film thickness upon development: about 15 μm; film thickness after curing: about 7.8 μm.
(2) Composition of solvent: water/isopropyl alcohol = 85/15 (wt. %).
(3) Characters of the alkaline components (basic compounds):

TPAH: tetra-n-propylammonium hydroxide
TMAH: tetramethylammonium hydroxide
TBAH: tetrabutylammonium hydroxide
BTEAH: benzyltriethylammonium hydroxide
CMAH: cethyltrimethylammonium hydroxide.
(4) Concentration of alkaline components (basic compounds):
Run No. 2: TMAH concentration = 0.15% (based on the weight of the solvent)
Run Nos. 3 to 8:
Expressed by the molar ratio of TMAH:TBAH based on the number of moles of TMAH at the TMAH concentration of 0.15 wt. % (the total number of moles of the amines is the same as that of 0.15 wt. % of TMAH)
Run Nos. 9 to 11:
Unified to the same number of moles as the TMAH amine of Run No. 2.

<Evaluation>

In Table 1, Run Nos. 1 and 2 are comparative examples. When TBAH (Run No. 9), BTEAH (Run No. 10) or CMAH (Run No. 11) having bulky substituent groups is used, resolution is greatly enhanced compared with the case where TPAH (Run No. 1) or TMAH (Run No. 2) was used. In addition, when TMAH is used in combination with TBAH (Run Nos. 3 to 8), the development time can be prevented from being lengthened while retaining good resolution.

EXAMPLE 2

<Effect of Addition of Organic Solvent>

An organic solvent (oxygen-containing compound) was added to various kinds of alkaline aqueous solutions to prepare various developers of different compositions, thereby comparing their effects upon development. This experiment was carried out in accordance with the test on <Resolution of various developers> in Example 1. Results are shown in Table 2.

TABLE 2

| Run No. | Alkaline component concentration: 0.017 moles (molar ratio) | Solvent added (wt. %) | pH | Resolution (μm) Temperature of developer 25° C. | 33° C. | Margin of film separation upon development (sec) | Development time min:sec |
|---|---|---|---|---|---|---|---|
| 12 | TMAH:TBAH (1:1) | Not added | 12.54 | x | 20 | 60 | 6:20 |
| 13 | TMAH:TBAH (1:1) | Isopropyl alcohol (1) | 12.51 | x | 20 | 45 | 6:20 |
| 14 | TMAH:TBAH (1:1) | Isopropyl alcohol (3) | 12.55 | 18 | — | 60 | 6:00 |
| 15 | TMAH:TBAH (1:1) | Isopropyl alcohol (15) | 12.54 | 12 | — | 120 | 5:45 |
| 16 | TMAH:TBAH (1:1) | Isopropyl alcohol (30) | 12.49 | 15 | — | 80 | 5:30 |
| 17 | TMAH:TBAH (1:1) | Isopropyl alcohol (40) | 12.47 | 18 | — | 30 | 5:20 |
| 18 | TMAH:TBAH (1:1) | Ethanol (15) | 12.52 | 20 | — | 70 | 6:10 |
| 19 | TMAH:TBAH (1:1) | Cyclopentanone (15) | 12.56 | 20 | — | 75 | 6:20 |
| 20 | TMAH:TBAH (1:1) | Ethyl acetate (3) | 12.52 | — | 20 | 80 | 6:10 |
| 21 | TMAH:TBAH (1:1) | Glycerol (15) | 12.50 | 18 | — | 65 | 6:20 |
| 22 | TBAH | Not added | — | x | 20 | 60 | 7:20 |
| 23 | TBAH | Isopropyl alcohol (15) | — | 13 | — | 90 | 5:55 |

TABLE 2-continued

| Run No. | Alkaline component concentration: 0.017 moles (molar ratio) | Solvent added (wt. %) | pH | Resolution (μm) Temperature of developer | | Margin of film separation upon development (sec) | Development time min:sec |
|---|---|---|---|---|---|---|---|
| | | | | 25° C. | 33° C. | | |
| 24 | BTEAH | Not added | — | x | 22 | 60 | 7:30 |
| 25 | BTEAH | Isopropyl alcohol (15) | — | 13 | — | 80 | 6:15 |

(Note)
(1) Film thickness upon development: about 15 μm; film thickness after curing: about 7.8 μm.
(2) Mark x indicates that developing speed was insufficient to form a pattern, and a film portion to be removed remained undeveloped.
(3) Mark - indicates that since developing speed becomes too fast, and a rate of a film portion to be left was decreased, the data was not evaluated.
(4) The development time means time required to form a pattern.
(5) The margin of film separation upon development means margin of time during which a pattern formed is retained when a film is overdeveloped after the formation of the pattern. The longer time indicates that the margin is wider, and such a developer is easier to use.
(6) Conditions of pH measurement: expressed in terms of a pH measured at 23° C. by means of a HORIBA PH Meter F-8L (pH meter manufactured by Horiba Ltd.) after 1 minute from the contact of each developer with the detector.

<Evaluation>

From the results shown in Table 2, it is understood that when the organic solvent (oxygen-containing compound) is added, resolution is enhanced, and development time can be shortened. It is also understood that when isopropyl alcohol is added to a combined system of TMAH and TBAH (Run Nos. 13 to 17), excellent resolution and wider development margin can be achieved. When isopropyl alcohol is added to TBAH (Run No. 23) and BTEAH (Run No. 25), effects of lowering development temperature, enhancing resolution, shortening development time and increasing development margin are achieved.

EXAMPLE 3

<Effect of Addition of Surfactant>

A surfactant was added to an alkaline aqueous solution to prepare a developer, thereby investigating its effect upon development. This experiment was carried out in accordance with the test on <Resolution of various developers> in Example 1. Results are shown in Table 3.

TABLE 3

| Run No. | Alkaline component concentration: 0.017 moles (molar ratio) | Solvent added (wt. %) Surfactant added (wt. %) | Resolution (μm) Temperature of developer 25° C. | Margin of film separation upon development (sec) | Development time min:sec |
|---|---|---|---|---|---|
| 26 | TMAH:TBAH (1:1) | Isopropyl alcohol (15) Adekatol LO-7 (0.05) | 12 | 105 | 5:20 |

(Note)
(1) Adekatol LO-7: surfactant produced by Asahi Denka Kogyo K.K.

<Evaluation>

From the results shown in Table 3, it is understood that when the surfactant is added, development time can be shortened.

What is claimed is:

1. A developer for photosensitive polyimide resin compositions, which is suitable for use in development after patterning exposure of a photosensitive layer formed from a photosensitive polyimide resin composition containing a polyamic acid having at least one photopolymerizable functional group in its molecular chain, the developer comprising an alkaline aqueous solution containing a basic compound (A) represented by formula (1):

$$\left( \bigcirc\!\!-\!\!CH_2 \right)_m X^+(R)_n \cdot Y^- \quad (1)$$

wherein $X^+$ is $N^+$ or $P^+$, R is an alkyl group having 1 to 20 carbon atoms or an aryl group having 6 to 10 ring forming carbon atoms, $Y^-$ is a monovalent anion, m is 0 or 1, n is 3 or 4 and m+n is 4, with the proviso. that when m is 0, n is 4, and R is an alkyl group, the total number of carbon atoms of the 4 alkyl groups is at least 13, or when m is, 1, n is 3, and R is an alkyl group, the total number of carbon atoms of the 3 alkyl groups is at least 6, and wherein the basic compound (A) is a benzyltrialkylammonium salt, a benzyltriarylammonium salt, a tetraalkylphosphonium salt, a benzyltrialkylphosphonium salt or a benzyltriarylphosphonium salt, and at least one basic compound (B) selected from the group consisting of tetraalkylammonium salts in which the 4 alkyl groups have not greater than 12 total carbon atoms, choline, tertiary aliphatic amines in which the number of carbon atoms of each aliphatic group is from 1 to 5, pyridine and derivatives thereof, the basic compounds being in a molar ratio (A:B) ranging from 5:95 to 90:10, and the alkaline aqueous solution having a pH of at least 10.0.

2. The developer according to claim 1, wherein the basic compound (A) represented by the formula (1) contains, OH⁻, or a halide anion selected from Cl⁻, Br⁻, F⁻ or I⁻ as the monovalent anion Y⁻.

3. The developer according to claim 1, wherein the benzyltrialkylammonium salt is a compound represented by a formula (4):

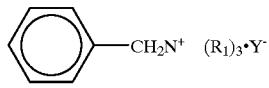 (4)

wherein $R_1$ is an alkyl group having 1 to 20 carbon atoms, with the proviso that the total number of carbon atoms of the 3 alkyl groups is at least 6, the 3 alkyl groups may be the same or different from one another, and Y⁻ is a monovalent anion.

4. The developer according to claim 1, wherein the benzyltriarylammonium salt is a compound represented by a formula (5):

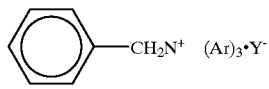 (5)

wherein Ar is an aryl group having 6 to 10 ring forming carbon atoms, and Y⁻ is a monovalent anion.

5. The developer according to claim 1, wherein the tetraalkylphosphonium salt is a compound represented by a formula (6):

 (6)

wherein $R_1$ is an alkyl group having 1 to 20 carbon atoms, with the proviso that the total number of carbon atoms of the 4 alkyl groups is at least 13, the 4 alkyl groups may be the same or different from one another, and Y⁻ is a monovalent anion.

6. The developer according to claim 1, wherein the benzyltrialkylphosphonium salt is a compound represented by a formula (7):

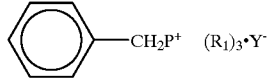 (7)

wherein $R_1$ is an alkyl group having 1 to 20 carbon atoms, with the proviso that the total number of carbon atoms of the 3 alkyl groups is at least 6, the 3 alkyl groups may be the same or different from one another, and Y⁻ is a monovalent anion.

7. The developer according to claim 1, wherein the benzyltriarylphosphonium salt is a compound represented by a formula (8):

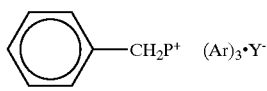 (8)

wherein Ar is an aryl group having 6 to 10 ring forming carbon atoms, and Y⁻ is a monovalent anion.

8. The developer according to claim 1, wherein the basic compound (A) represented by the formula (1) is benzyltriethylammonium hydroxide, benzyltriphenylammonium hydroxide, tetrabutylphosphonium hydroxide or benzyltriethylphosphonium hydroxide.

9. The developer according to claim 1, wherein a medium of the alkaline aqueous solution comprises at least 51 wt. % of water and at most 49 wt. % of at least one component selected from the group consisting of organic solvents and surfactants.

10. The developer according to claim 9, wherein the organic solvent is at least one oxygen-containing compound selected from the group consisting of monohydric alcohols, polyhydric alcohols, ketones and esters.

11. The developer according to claim 9, wherein the medium of the alkaline aqueous solution comprises water and 1 to 40 wt. % of the organic solvent.

12. The developer according to claim 9, wherein the medium of the alkaline aqueous solution comprises water, 1 to 40 wt. % of the organic solvent and 0.01 to 1 wt. % of the surfactant.

13. The developer according to claim 1, wherein the polyamic acid is a polyamic acid having, in its main chain, repeating units represented by a formula (9):

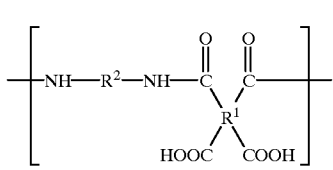 (9)

wherein $R^1$ is a tetravalent organic group, and $R^2$ is a bivalent organic group, and at both terminals thereof, at least one actinic ray-sensitive functional group selected from the group consisting of a group $Z^1$ represented by a formula (10):

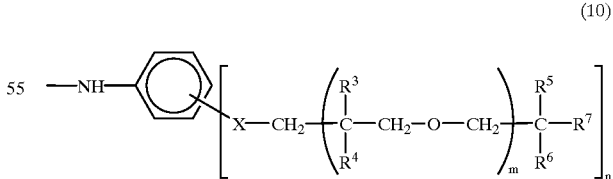 (10)

wherein X is a single bond, —O—, —CO—, —COO—, —OCO—, —OCOO—, —COCH₂O—, —S—, —SO—, —SO₂— or —SO₂—, $R^3$, $R^4$, $R^5$, $R^6$ and $R^7$ are independently a substituent group having a photopolymerizable carbon-carbon double bond, m is 0 or 1, and n is an integer within a range of from 1 to 3, and a group $Z^2$ represented by a formula (11):

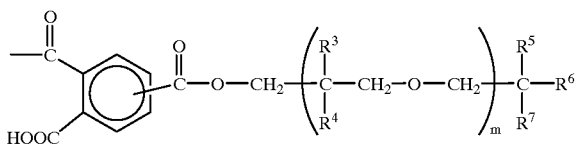

(11)

wherein $R^3$, $R^4$, $R^5$, $R^6$ and $R^7$ are independently a substituent group having a photopolymerizable carbon-carbon double bond, and m is 0 or 1.

14. The developer according to claim 1, wherein the photosensitive polyimide resin composition comprises the polyamic acid, a photosensitive auxiliary, a photopolymerization initiator and a solvent in an amount sufficient to uniformly dissolve the individual components.

15. The developer according to claim 14, wherein the photosensitive polyimide resin composition further comprises at least one of 1H-tetrazoles.

16. A pattern forming process comprising the steps of forming a photosensitive layer on a substrate with a photosensitive resin composition comprising a polyamic acid, subjecting the photosensitive layer to patterning exposure, and then developing the thus-exposed photosensitive layer using the developer of claim 1.

17. A pattern forming process according to claim 16, wherein the alkaline aqueous solution has a pH in the range of from 10.0 to 13.8.

18. A pattern forming process according to claim 16, wherein the alkaline aqueous solution has a pH in the range of from 11.0 to 13.0.

19. The developer according to claim 1, further comprising 1 to 40 wt. % of an organic solvent.

20. The developer according to claim 19, wherein the alkaline aqueous solution has a pH in the range of from 10.0 to 13.8.

21. The developer according to claim 19, wherein the alkaline aqueous solution has a pH in the range of from 11.0 to 13.0.

22. The developer according to claim 1, wherein the alkaline aqueous solution has a pH in the range of from 10.0 to 13.8.

23. The developer according to claim 1, wherein the alkaline aqueous solution has a pH in the range of from 11.0 to 13.0.

\* \* \* \* \*

UNITED STATES PATENT AND TRADEMARK OFFICE
CERTIFICATE OF CORRECTION

PATENT NO. : 6,403,289 B1  
DATED : June 11, 2002  
INVENTOR(S) : Akira Tanaka et al.

It is certified that error appears in the above-identified patent and that said Letters Patent is hereby corrected as shown below:

Column 18,  
Line 37, change "proviso." to -- proviso --.  
Line 39, change "m is, 1," to -- m is 1, --.

Signed and Sealed this

Twenty-third Day of July, 2002

*Attest:*

*Attesting Officer*

JAMES E. ROGAN  
*Director of the United States Patent and Trademark Office*